United States Patent [19]

Singh

[11] Patent Number: 6,065,667
[45] Date of Patent: May 23, 2000

[54] METHOD AND APPARATUS FOR FINE PITCH WIRE BONDING

[75] Inventor: Inderjit Singh, San Jose, Calif.

[73] Assignee: National Semiconductor Corporation, Santa Clara, Calif.

[21] Appl. No.: 08/784,271

[22] Filed: Jan. 15, 1997

[51] Int. Cl.[7] .................................................. H01L 21/60
[52] U.S. Cl. ........................................ 228/180.5; 228/4.5
[58] Field of Search .................................. 228/4.5, 180.5

[56] References Cited

U.S. PATENT DOCUMENTS

| | | | |
|---|---|---|---|
| 3,357,090 | 12/1967 | Tiffany | 29/470 |
| 4,096,983 | 6/1978 | Beilein et al. | 228/122 |
| 4,219,143 | 8/1980 | Gailland | 228/159 |
| 4,415,115 | 11/1983 | James | 228/170 |
| 4,437,604 | 3/1984 | Razon et al. | |
| 4,717,066 | 1/1988 | Goldenberg et al. | 228/179 |
| 4,750,666 | 6/1988 | Neugebauer et al. | 228/160 |
| 4,761,386 | 8/1988 | Buynoski | 437/203 |
| 4,763,826 | 8/1988 | Kulicke, Jr. et al. | |
| 4,821,945 | 4/1989 | Chase et al. | 228/179 |
| 4,886,200 | 12/1989 | Tsumura | 228/1.1 |
| 4,907,734 | 3/1990 | Conru et al. | 228/123 |
| 4,955,523 | 9/1990 | Calomagno et al. | 228/179 |
| 4,974,767 | 12/1990 | Alfaro et al. | |
| 5,060,843 | 10/1991 | Yasuzato et al. | 228/179 |
| 5,111,989 | 5/1992 | Holdgrafer et al. | |
| 5,148,964 | 9/1992 | Shimizu | 228/102 |
| 5,195,682 | 3/1993 | Rabinovich | 228/179 |
| 5,201,454 | 4/1993 | Alfaro et al. | 228/110 |
| 5,206,186 | 4/1993 | Neugebauer et al. | 437/183 |
| 5,244,140 | 9/1993 | Ramsey et al. | 228/110.1 |
| 5,302,550 | 4/1994 | Hirota et al. | 437/194 |
| 5,402,927 | 4/1995 | Frasch. | |
| 5,421,503 | 6/1995 | Perlberg et al. | 228/4.5 |
| 5,437,405 | 8/1995 | Asanasavest. | |
| 5,465,899 | 11/1995 | Quick et al. | 228/180.5 |
| 5,494,207 | 2/1996 | Asanasavest. | |
| 5,516,029 | 5/1996 | Grasso et al. | 228/180.5 |
| 5,544,804 | 8/1996 | Test et al. | 228/180.5 |
| 5,558,270 | 9/1996 | Nachon et al. | 228/180.5 |
| 5,595,328 | 1/1997 | Safabakhsh et al. | |
| 5,718,546 | 2/1998 | Yariv et al. | |
| 5,764,486 | 6/1998 | Pendse | 361/774 |
| 5,871,141 | 2/1999 | Hadar et al. | 228/180.5 |

FOREIGN PATENT DOCUMENTS

| | | | |
|---|---|---|---|
| 55-96643 | 7/1980 | Japan | 228/4.5 |
| 59-191338 | 10/1984 | Japan | 228/4.5 |
| 61-5536 | 1/1986 | Japan | 228/4.5 |
| 3-27544 | 2/1991 | Japan | 228/4.5 |
| 9-148358 | 6/1997 | Japan. | |

*Primary Examiner*—Patrick Ryan
*Assistant Examiner*—Jeffrey T. Knapp
*Attorney, Agent, or Firm*—Beyer & Weaver, LLP

[57] ABSTRACT

A capillary for use in wire bonding has a wire feed bore extending from a top end of the capillary toward a capillary tip. A cavity in the capillary tip is adjacent to and contiguous with a chamfer in the wire feed bore. The cavity defines cavity walls and a recessed tip surface. The cavity can be substantially cylindrical. The recessed tip surface can be tapered relative to a horizontal axis. The portion of the capillary tip outside of the cavity defines a wedge surface which is used for wedge bonding. The cavity allows for precision small ball bonds which are strong and which have an even bonding surface distribution. The cavity molds the ball bond into a shape substantially similar to the shape of the cavity. Although there is some flash of wire metal out from the cavity, the flash is minimized and the ball bond diameter is held to a minimum by the molding effects of the cavity. The size of the ball bond is dependent only on the size of the free air ball. The size of the ball bond is not dependent on the power, force, and time duration of the ultrasonic energy delivered during formation of the ball bond. The cavity provides a strong ball bond by allowing for even distribution of bonding on the bonding surface. The intermetallic formation at the interface of the wire metal and bond pad metal is evenly distributed.

16 Claims, 5 Drawing Sheets

METHOD AND APPARATUS FOR FINE PITCH WIRE BONDING

FIELD OF THE INVENTION

The present invention pertains to an apparatus and method for wire bonding. More particularly, the present invention relates to a capillary for wire bonding in fine pitch semiconductor devices.

BACKGROUND OF THE INVENTION

There has been a continuing trend in the semiconductor industry toward smaller semiconductor devices with higher transistor density and an increasing number of input/output connections. This trend has led to semiconductor devices having an increased density of chip input/output connections and shrinking bond pad sizes. Semiconductor devices having small bond pad center to center distances are called fine pitch semiconductor devices. Wire bonding technology is currently being challenged by requirements of semiconductor devices having bonding pad center to center distances of less than 100 micrometers.

In semiconductor fabrication, wire bonding remains the dominant chip interconnection technology for fine pitch semiconductor devices. Gold or aluminum wire is commonly used to connect a bonding pad of a semiconductor die to a lead of the semiconductor device. Typically, ball bonding is used to connect the wire to the bond pad while wedge bonding, also called stitch bonding, is used to connect the wire to the lead. Commonly, a wire bonding apparatus including a capillary is used for both the ball bonding and the wedge bonding.

FIG. 1A shows a vertical cross section of a prior art capillary 100. The capillary 100 includes a longitudinal bore 102 formed therethrough. The longitudinal bore 102 forms a top aperture (not shown) in a top end of the capillary 100 and a bottom aperture 104 in a bottom end of the capillary 100. The longitudinal bore 102 typically includes a chamfer 105 having a maximum chamfer diameter 106 at the bottom end of the capillary 100. The outer diameter of the bottom end of the capillary 100 has an outer diameter tip dimension 108. In operation, wire is fed downward through the longitudinal bore 102, and out the bottom aperture 104, of the capillary 100.

FIG. 1B shows a vertical cross section of the capillary 100 horizontally restraining a wire 110 while an electronic flame off mechanism (EFO) 112 applies energy to a distal end of the wire 110. The application of energy by the EFO 112 creates a free air ball 114 at the distal end of the wire 110. The wire 110 is held by a clamp (not shown) during this free air ball formation process. Size parameters of the free air ball 114 include a free air ball diameter 115. For a wire bonding apparatus using the capillary 100, the size of the free air ball 114 can be controlled by varying hardware and software parameters of the wire bonding apparatus. After formation of the free air ball 114, the clamp releases the wire 110 and the capillary 100 is used to apply a force to the free air ball 114 to bond the distal end of the wire 110 to a bond pad surface as explained below.

FIG. 1C shows a vertical cross section of the capillary 100 being used to form a ball bond 115 between the distal end of the wire 110 and a surface of a bond pad 116. The bond pad 116 is located on a semiconductor die which has a center to center bond pad distance 118 (also called the bond pad pitch of the semiconductor device). After the formation of the free air ball 114, as explained above, the free air ball 114 (FIG. 1B) is forced downward to the bond pad 116 by the capillary 100. The force of the capillary 100 is used in conjunction with ultrasonic energy to create the ball bond 115 between the distal end of the wire 110 and the bond pad 116. Size parameters associated with the ball bond 115 include a ball bond height 120 and a ball bond diameter 122.

As the center to center bond pad distance 118 (or bond pad pitch) is decreased in a semiconductor device, the size of the bond pad 116 is typically decreased. For example, a semiconductor device having a 70 micron bond pad pitch can have a 60 micron×60 micron bond pad 116. It is very difficult to consistently achieve a ball bond 115 small enough to fit on a bond pad 116 of this size using the capillary 100. The ball bond diameter 122 must be limited in order to prevent flash of wire metal over to an adjacent bond pad 116 thereby creating a short between adjacent bond pads 116. A short between adjacent bond pads 116 can result in operational failure of the semiconductor device.

With reference still to FIG. 1C, one problem with use of the capillary 100 is that it is difficult to precisely control the size of the ball bond 115. For a wire bonding apparatus using the capillary 100, the size of the ball bond 115 (including the ball bond height 120 and ball bond diameter 122) is dependent on the size of the free air ball 114 (FIG. 1B). Hardware and software parameters of the bonding apparatus must be adjusted to vary the size of the free air ball 114 (FIG. 1B). For a wire bonding apparatus using the capillary 100, the size of the ball bond 115 is also dependent on parameters such as the power, force, and time of the ultrasonic energy delivered during the formation of the ball bond 115. For ball bonding of fine pitch semiconductor devices, the tip dimension 108 of the capillary 100 can be reduced so that the capillary 100 can form a ball bond 115 small enough to fit on the small bond pad 116. However, reducing the outer diameter tip dimension 108 weakens the capillary 100 which is subjected to great stress particularly during wedge bonding as explained below. The most significant factors that decide the shape and strength of the ball bond 115 are the tip dimension 108 and chamfer diameter 106 of the capillary 100.

Another problem with using the capillary 100 to form a ball bond is that intermetallic bonding formation tends to occur primarily along the periphery of the ball bond 115. The ball bond 115, formed using the capillary 100, has very little or no intermetallic formation in the central surface region of the ball bond 115. The result is a weak ball bond 115. The intermetallic formation problem is due to the fact that the capillary 100 does not optimally translate ultrasonic energy during formation of the ball bond 115.

FIG. 1D shows a vertical cross section of a wedge bond 124 formed by the capillary 100. The wedge bond 124 is formed between an extended length of the wire 110 and a surface of an inner lead 126 of a lead frame. Reducing the tip dimension 108 of the capillary 100, to reduce the size of the ball bond 115 as described above, causes degradation in strength of the wedge bond 124. This is due to the fact that the area in which the wedge bond 124 is formed depends on the outer diameter tip dimension 108 of the capillary 100. Therefore, a difficult problem with using the capillary 100 concerns the tradeoff between a small outer diameter tip dimension 108 for achieving small ball bonds and a larger outer diameter tip dimension 108 for achieving strong wedge bonds.

In view of the foregoing, an improved capillary design that facilitates more consistent ball bonding in fine pitch semiconductor devices will be described.

SUMMARY OF THE INVENTION

The present inventions pertains to a wire bonding method and apparatus for forming both ball bonds and wedge bonds in fine pitch semiconductor devices. A capillary according to the present invention has a wire feed bore extending from a top end of the capillary to a bottom end of the capillary which forms a capillary tip. The wire feed bore includes a chamfer. In an embodiment of the present invention, the chamfer can widen in a direction from the top end of the capillary towards the capillary tip at an angle which can vary depending on the needs of a particular application. The chamfer has a maximum chamfer diameter. The maximum chamfer diameter can also be varied depending on the needs of a particular wire bonding application.

A cavity in the capillary tip is adjacent to and continuous with the chamfer in the wire feed bore. The cavity defines cavity walls and a recessed tip surface. In an embodiment of the present invention, the cavity is substantially cylindrical and has a cavity diameter which is greater than the maximum chamfer diameter of the chamfer. The recessed tip surface can be tapered relative to a horizontal axis. In another embodiment of the present invention, the cavity walls are tapered relative to a vertical axis so that the cavity is substantially frusto-conical. The cavity diameter can be varied depending on the needs of a particular wire bonding application. The cavity 214 has a cavity height which can also be varied depending on the needs of a particular wire bonding application. In an embodiment of the present invention, all edges of the cavity are rounded. The portion of the capillary tip outside of the cavity defines a wedge surface which is used for wedge bonding.

The cavity allows for molding precision small ball bonds which are strong and which have an even bonding surface distribution. During ball bonding, the recessed tip surface applies force to create the ball bond. The cavity walls apply force to mold the ball bond into a shape that is substantially similar to the shape of the cavity. Flash of wire metal outside of the cavity is minimized, using the capillary of the present invention, due to the molding effects of the cavity. By forming a free air ball having a volume slightly larger than the volume of the cavity, flash of wire metal outside of the cavity is minimized.

The size of the ball bond, formed using the capillary according to the present invention, is dependent only on free air ball formation. Due to molding effects of the cavity, the size of the ball bond, formed using the capillary of the present invention, is not dependent on the power, force, and time duration of ultrasonic energy delivered during formation of the ball bond. Therefore, there is no need to enhance hardware and software of the wire bonding apparatus to control these ultrasonic energy parameters for the purpose of controlling the size of the ball bond. Furthermore, the cavity provides a strong ball bond by allowing for even distribution of bonding on the bonding surface. That is, the intermetallic formation at the interface of the wire metal and bond pad metal is evenly distributed. This even bonding surface distribution results because the cavity allows for effective translation of ultrasonic energy during formation of the ball bond.

A wire bonding apparatus using the capillary of the present invention requires a small area of contact to make a wedge bond. Because a wire bonding apparatus using the capillary of the present invention requires a small area of contact to make a wedge bond, the present invention is particularly useful for forming wedge bonds on very fine inner lead pitch frames.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In the following detailed description of the present invention, numerous specific details are set forth in order to provide a thorough understanding of the present invention. However, as will be apparent to those skilled in the art, the present invention may be practiced without these specific details or by using alternate elements or processes. In other instances well known processes, procedures, components, and circuits have not been described in detail so as not to unnecessarily obscure aspects of the present invention.

Figure 1A:
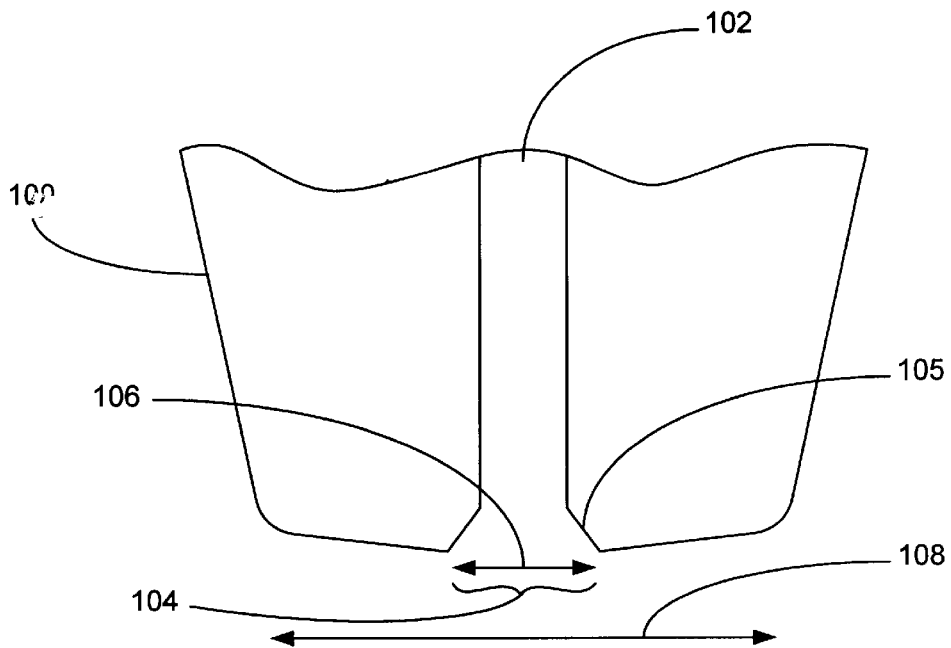
FIG. 1A is a vertical cross section of a prior art capillary for wire bonding of semiconductor devices.
Figure 1B:
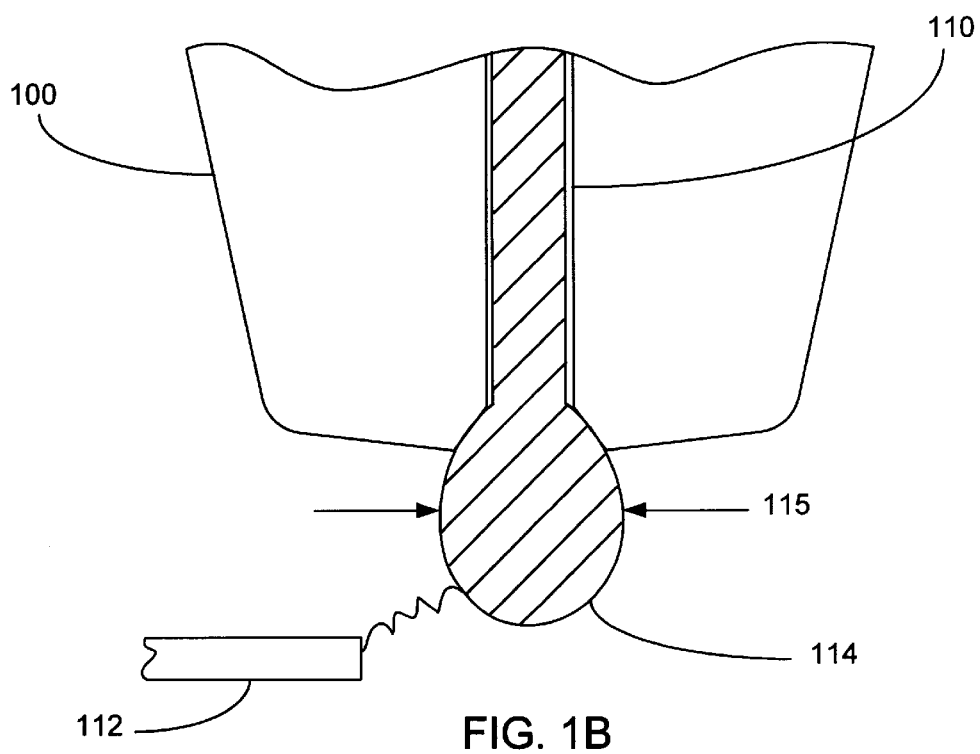
FIG. 1B is a vertical cross section of a free air ball horizontally constrained by the prior art capillary.
Figure 1C:
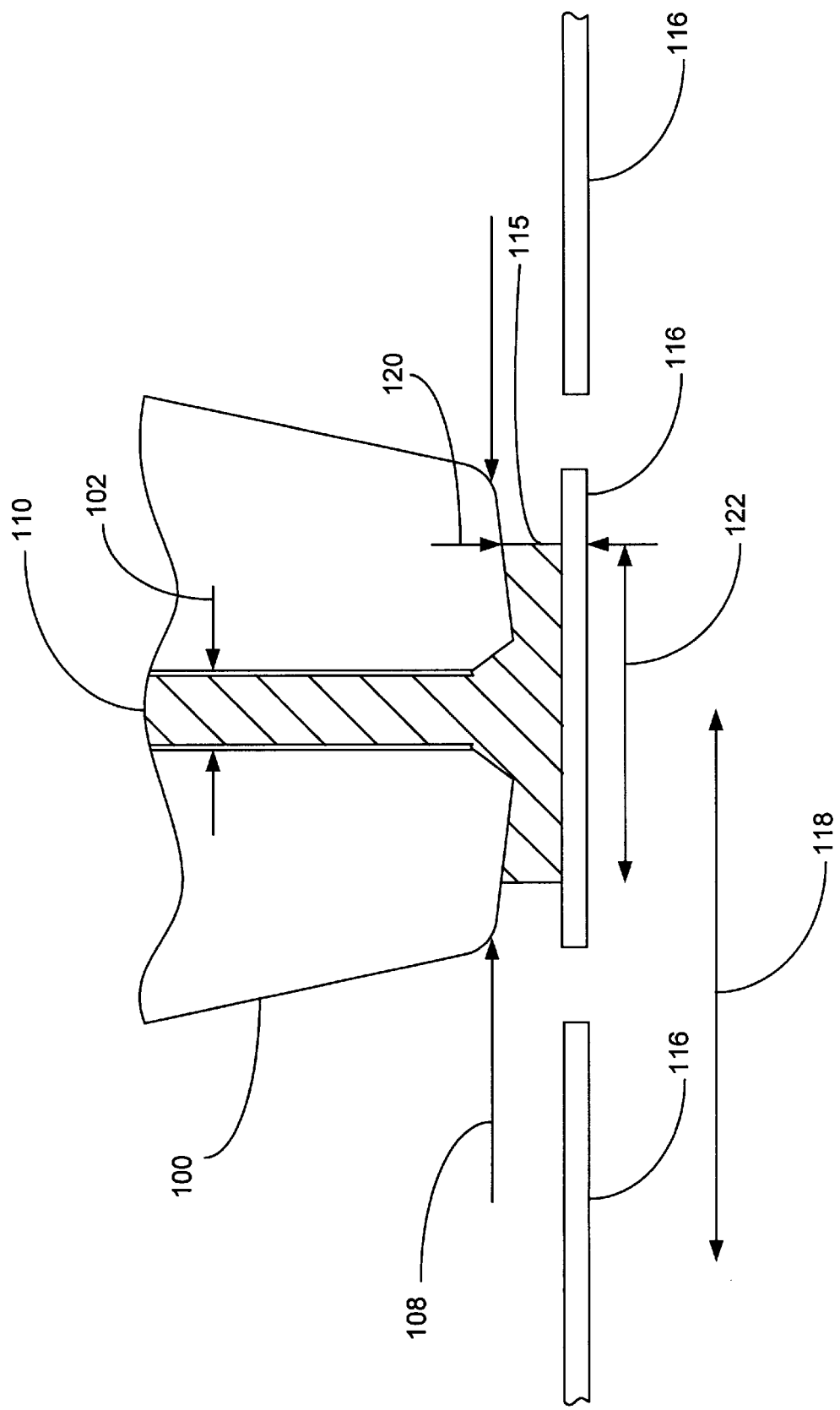
FIG. 1C is a vertical cross section of a ball bond created by a bonding apparatus using the prior art capillary.
Figure 1D:
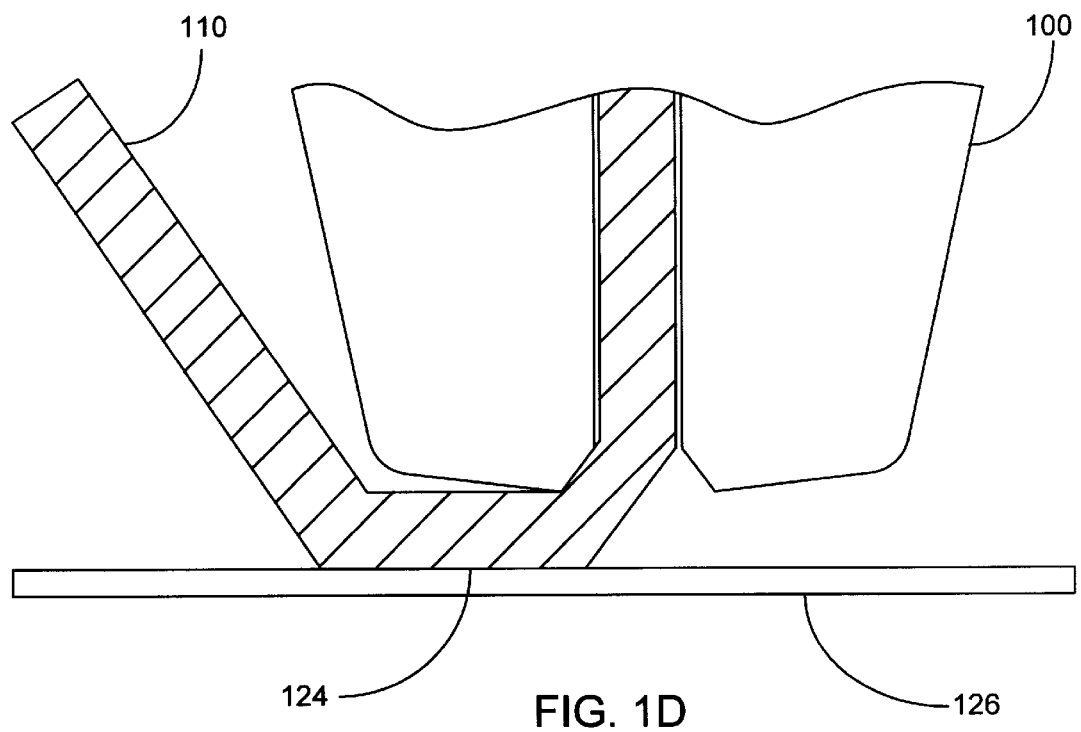
FIG. 1D is a vertical cross section of a wedge bond created by a bonding apparatus using the prior art capillary.
Figure 2:
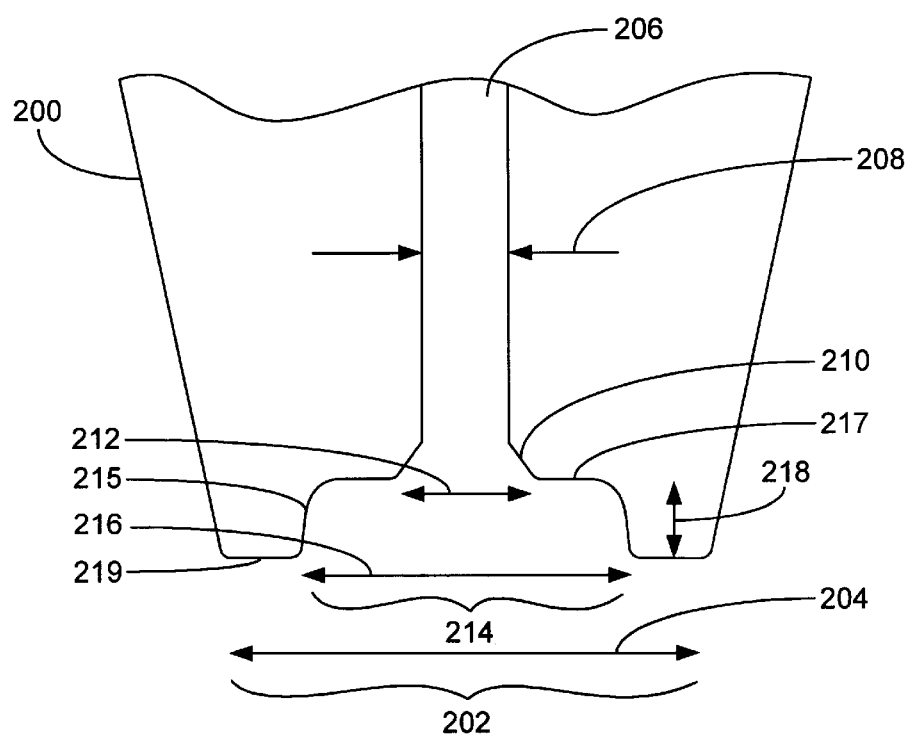
FIG. 2 is a vertical cross section of a capillary formed in accordance with one embodiment of the present invention for wire bonding of semiconductor devices.

With reference to FIG. 2, a vertical cross section of a capillary 200 according to the present invention is shown. The capillary 200 can be used for both ball bonding and wedge bonding. In an embodiment of the present invention, the capillary 200 can be a substantially cylindrical body having an outer diameter which tapers from a top end (not shown) of the capillary 200 to a bottom end of the capillary 200. The bottom end of the capillary 200 forms a capillary tip 202. The capillary tip 202 has an outer diameter tip dimension 204. The outer diameter tip dimension 204 can be varied depending on the needs of a particular application. For example, an outer diameter tip dimension 204 of about 70 microns has been found to work well for use in wire bonding of a semiconductor device having a 60 micron center to center bond pad distance. An outer diameter tip dimension 204 of about 80 microns has been found to work well for use in wire bonding of a semiconductor device having a 70 micron center to center bond pad distance.

A wire feed bore 206, having a minimum bore diameter 208, extends from the top end of the capillary 200 towards the capillary tip 202. The minimum bore diameter 208 can be varied depending on the diameter of wire required for a bonding application. For example, a minimum bore diameter 208 of about 33 microns has been found to work well for wire bonding applications requiring a wire diameter of about 25.4 microns.

The wire feed bore 206 includes a chamfer 210. In an embodiment of the present invention, the chamfer 210 can widen in a direction from the top end of the capillary 200 towards the capillary tip 202 at an angle which can vary depending on the needs of a particular application. By way of example, a face angle of between about 0 degrees and about 10 degrees has been found to work well. The chamfer 210 has a maximum chamfer diameter 212. The maximum chamfer diameter 212 can be varied depending on the needs of a particular wire bonding application. For wire bonding applications requiring wire having a diameter of about 25.4 microns, a maximum chamfer diameter 212 of about 36 microns to about 38 microns has been found to work well.

A cavity 214 in the capillary tip 202 is adjacent to and continuous with the chamfer 210 in the wire feed bore 206. The cavity 214 defines cavity walls 215 and a recessed tip surface 217. In an embodiment of the present invention, the cavity 214 is substantially cylindrical and has a cavity diameter 216 which is greater than the maximum chamfer diameter 212 of the chamfer 210. The recessed tip surface 217 can be tapered relative to a horizontal axis. In another embodiment of the present invention, the cavity walls 215 are tapered relative to a vertical axis so that the cavity 214 is substantially frusto-conical. By way of example, tapers on the order of about 5% work well. The cavity diameter 216 can be varied depending on the needs of a particular wire bonding application. For example, cavity diameters 216 of about 40 microns to about 46 microns have been found to work well for use in wire bonding of semiconductor devices having center to center bond pad distances of about 60 microns to about 70 microns. The cavity 214 has a cavity height 218. The cavity height 218 can also be varied depending on the needs of a particular wire bonding application. For example, a cavity height 218 of about 15 microns has been found to work well for use in wire bonding of semiconductor devices having center to center bond pad distances of about 60 microns to about 70 microns. In an embodiment of the present invention, all edges of the cavity 214 are rounded. The portion of the capillary tip 202 outside of the cavity 214 defines a wedge surface 219.

With reference still to FIG. 2, the capillary 200 can be used with a wire bonding apparatus for both ball bonding and wedge bonding. In operation, wire is fed through the wire feed bore 206. For ball bonding, an electronic flame off (EFO) mechanism is used to create a free air ball at a distal end of the wire. Then, the bottom end 202 of the capillary 200 is used, in conjunction with ultrasonic energy provided by the wire bonding apparatus, to force the free air ball onto a surface of a bond pad in order to create a ball bond. The cavity 214 of the capillary 200 provides precision small ball bonds which are strong as explained below. The capillary 200 is well suited for use in ball bonding of semiconductor devices having very small center to center bond pad distances (fine bond pad pitch) and very small bond pad surface areas. The capillary 200 is also well suited for use in wedge bonding of semiconductor devices having very small center to center lead distances (fine lead frame pitch). These and other advantages of the present invention are explained below.

Figure 3:
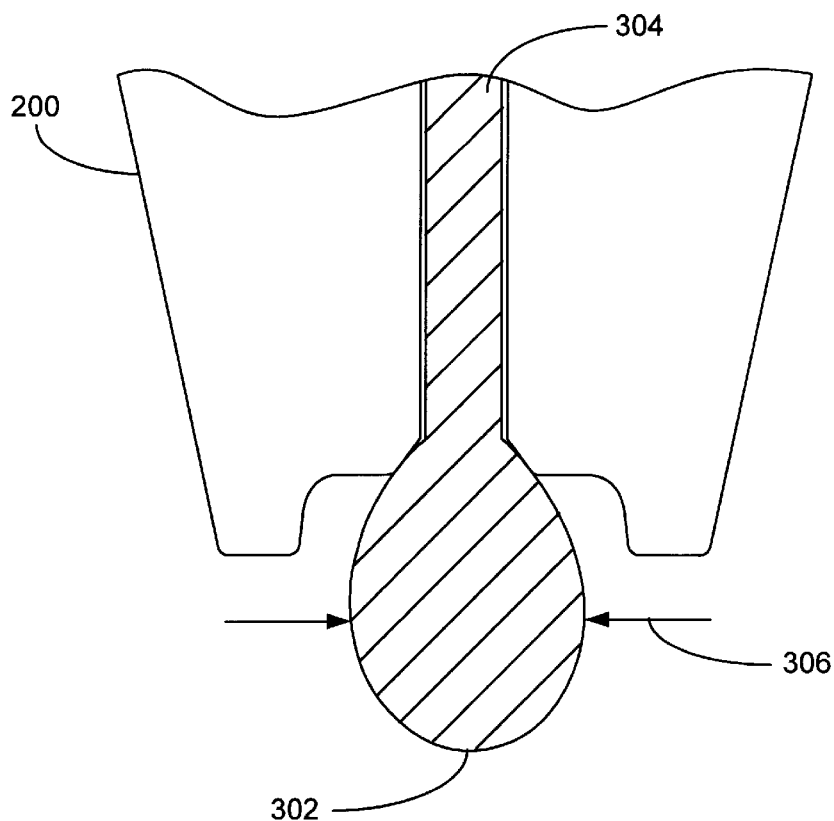
FIG. 3 is a vertical cross section of a free air ball horizontally constrained by the capillary illustrated in FIG. 2.

FIG. 3 shows a vertical cross section of a free air ball 302 at a distal end of a wire 304 which is horizontally constrained by the capillary 200. In an embodiment of the present invention, the wire 304 is about 25 microns to about 30 microns in diameter. However, it is understood that wire of different diameters can be used in the present invention. In an embodiment of the present invention, the wire 304 can be made of gold or aluminum. The free air ball 302 has a free air ball diameter 306. As mentioned above, an EFO mechanism is used in conjunction with wire bonder hardware and software to create the free air ball 302. The cavity 214 of the capillary 200 allows for consistent free air ball formation with no need to enhance bonder hardware and software. In an embodiment of the present invention, the EFO mechanism and other parameters can be controlled so that the free air ball 302 has a volume slightly larger than the volume of the cavity 214 of the capillary 200.

Figure 4:
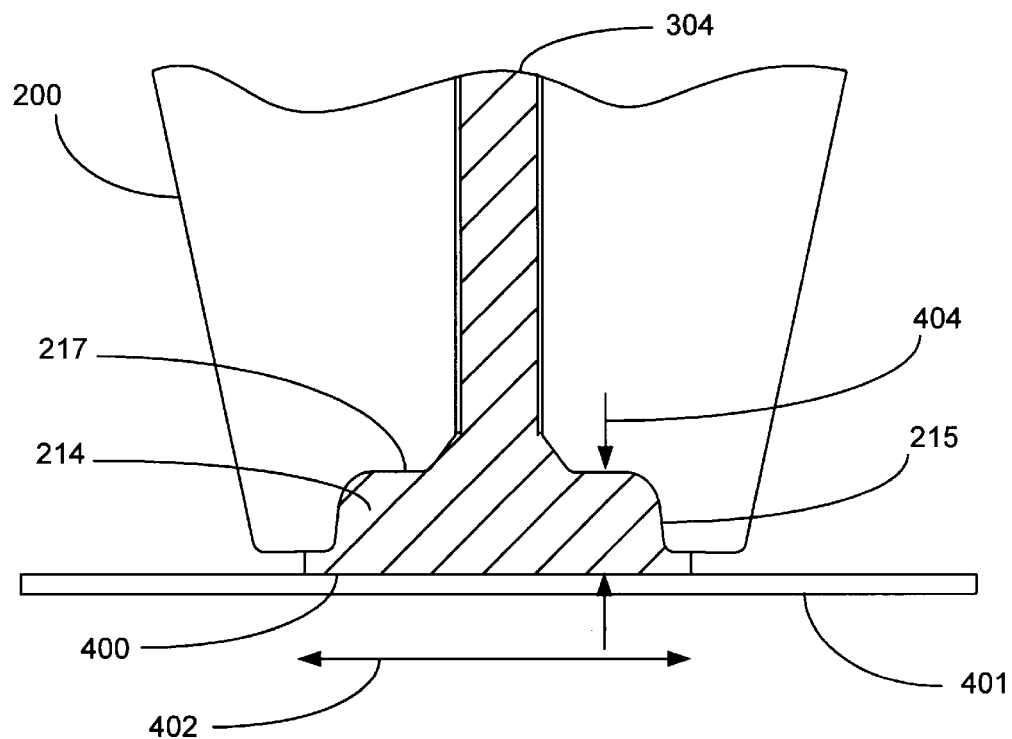
FIG. 4 is a vertical cross section of a ball bond created by a bonding apparatus using the capillary illustrated in FIG. 2.

FIG. 4 shows a vertical cross section of a ball bond 400 formed by a wire bonding apparatus using the capillary 200 of the present invention. The ball bond 400 is formed between the distal end of the wire 304 and a bond pad 401. A wire bonding apparatus is used in conjunction with the capillary 200, ultrasonic energy and thermal energy from a heated stage to form the ball bond 400. Size parameters of the ball bond 400 include a ball bond diameter 402 and a ball bond height 404.

With reference still to FIG. 4, the capillary 200 allows for formation of a precision small ball bond 400. The cavity 214 of the capillary 200 molds the ball bond 400. The recessed tip surface 217 applies force to create the ball bond 400. The cavity walls 215 apply force to mold the ball bond 400 into a shape that is substantially similar to the shape of the cavity 214. By controlling the size of the free air ball relative to the cavity size, the amount of "flash" (i.e. material that extends beyond the cavity) can be controlled. When the free air ball is slightly larger than the cavity size, there will be some flash of wire metal out from the cavity 214 (as depicted in exaggerated form in FIG. 4), meaning the ball bond diameter 402 is greater than the cavity diameter 216. However, experiments have shown that the flash can be completely eliminated with good bonding results. When the flash is eliminated, the ball bond diameter 402 is held to a minimum by the presence of the cavity 214 of the capillary 200 (FIG. 2).

The size of the ball bond 400, formed using the capillary 200, is dependent only on the size of the free air ball 302 (FIG. 3). Due to molding effects of the cavity 214, the size of the ball bond 400, formed using the capillary 200, is not dependent on the power, force, and time duration of the ultrasonic energy delivered during formation of the ball bond 400. Therefore, there is no need to enhance hardware and software of the wire bonding apparatus, to control these ultrasonic energy parameters, for the purpose of controlling the size of the ball bond 400.

With reference still to FIG. 4, the cavity 214 of the capillary 200 provides a strong ball bond 400 by allowing for even distribution of bonding on the bonding surface. That is, the intermetallic formation at the interface of the wire metal and bond pad metal is evenly distributed. This even bonding surface distribution results because the cavity 214 of the capillary 200 allows for effective translation of ultrasonic energy during formation of the ball bond 400. During the ball bonding process, the cavity walls 215 apply inward force upon the wire metal in the cavity 214. The inward force applied by the cavity walls 215 contributes to the formation of the evenly distributed intermetallic formation at the interface of the wire metal and bond pad metal.

Figure 5:
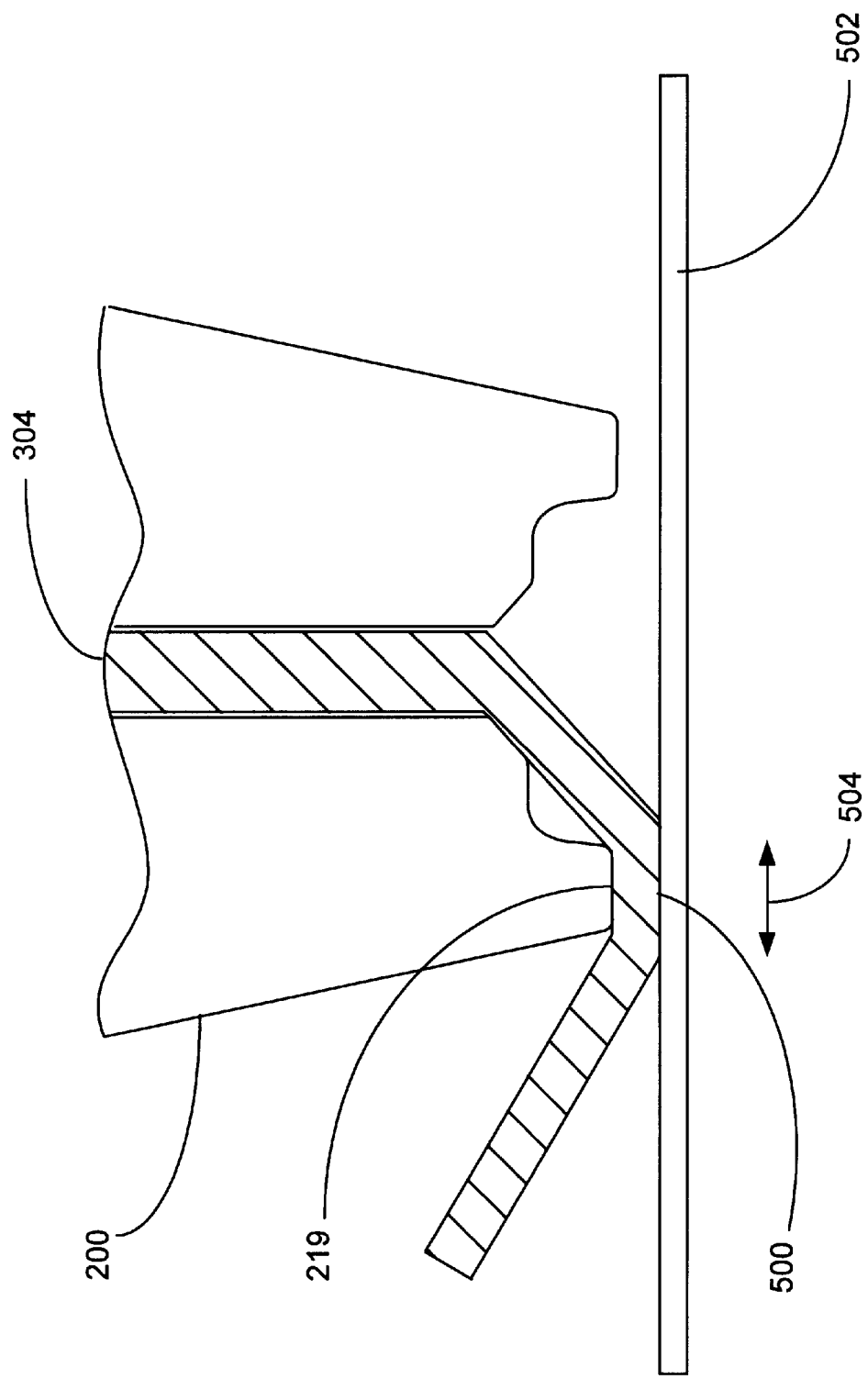
FIG. 5 is a vertical cross section of a wedge bond created by a bonding apparatus using the capillary illustrated in FIG. 2.

FIG. 5 shows a vertical cross section of a wedge bond 500 formed by a wire bonding apparatus using the capillary 200 of the present invention. During wedge bonding, the wedge surface 219 of the capillary 200 applies a force to a section of the wire 304. The wedge bond 500 can be formed between the section of the wire 304 and a surface of a lead 502 of a semiconductor device. A wire bonding apparatus using the capillary 200 of the present invention requires a small area of contact to make a wedge bond 500. The wedge bond 500 has a wedge bond length 504. Because a wire bonding apparatus using the capillary 200 of the present invention requires a small area of contact to make a wedge bond 500, the capillary 200 is particularly useful for forming wedge bonds 500 on very fine inner lead pitch frames.

In an embodiment of the present invention for use in wire bonding of semiconductor devices having a 70 micron center to center bond pad distances (70 micron bond pad pitch), the capillary 200 has been found to work well with the dimensions defined below. Dimensions are provided for a 70 micron bond pad pitch application using gold wire which is about 25.4 microns in diameter. The minimum bore diameter 208 can be about 33 microns. The outer diameter tip dimension 204 can be about 80 microns. The maximum chamfer diameter 212 can be about 38 microns. The cavity diameter 216 can be about 46 microns. The cavity height 218 can be about 15 microns. A capillary 200 having these dimensions and using a free air ball 302 having a free air ball diameter 306 of about 40 microns, will form a ball bond 400 having a ball bond diameter 402 of about 48 to about 50 microns. A capillary 200 having these dimensions will form a ball bond 400 having a ball bond height 404 of about 15 microns.

In an embodiment of the present invention for use in wire bonding of semiconductor devices having a 60 micron center to center bond pad distances (60 micron bond pad pitch), the capillary 200 has been found to work well with the dimensions defined below. These dimensions are provided for a 60 micron bond pad pitch application using gold wire which is about 25.4 microns in diameter. The minimum bore diameter 208 can be about 33 microns. The outer diameter tip dimension 204 can be about 70 microns. The maximum chamfer diameter 212 can be about 36 microns. The cavity diameter 216 can be about 40 microns. The cavity height 218 can be about 15 microns. A capillary 200 having these dimensions and using a free air ball 302 having a free air ball diameter 306 of about 36 microns, will form a ball bond 400 having a ball bond diameter 402 of about 44 microns. A capillary 200 having these dimensions forms a ball bond 400 having a ball bond height 404 of about 15 microns.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A capillary for use in a wire bonding apparatus, the capillary comprising:
   a capillary body including a capillary tip and a wire feed bore sized suitably for receiving a bonding wire there through;
   a ball bond molding cavity formed in the capillary tip, the cavity including cavity walls and a recessed tip surface, wherein the portion of the capillary tip outside of the cavity defines a wedge bonding surface and the cavity is sized and shaped to mold balls formed during ball bonding into a shape that is substantially similar to the shape of the cavity;
   a chamfer at a distal portion of the wire feed bore that opens into the ball bond molding cavity, wherein the chamfer area provides a relief area suitable for receiving excess ball material during ball bonding.

2. A method of wire bonding using a capillary having a cavity recessed in a tip portion of a capillary body, a wire feed bore and a chamfer area that opens from the wire feed bore into the cavity such that the cavity defines cavity walls and a recessed tip surface, the method comprising the steps of:
   forming a free air ball at a distal end of a bonding wire received within the wire feed bore, wherein the free air ball has a volume that is slightly larger then the volume of the cavity; and
   forcing the free air ball into contact with a bonding surface such that the recessed tip surface applies force to create a ball bond between the free air ball and the bonding surface, and wherein the cavity walls apply force to mold the ball bond into a shape that is substantially similar to the shape of the cavity and at least a portion of the chamfer area and the formation of flash outside of the cavity is minimized during ball bonding.

3. A method as recited in claim 2 further comprising the step of forming a wedge bond using the wedge surface of the capillary body.

4. A method as recited in claim 2 wherein the capillary has a substantially cylindrical body outer surface which is tapered towards the capillary tip so that ball bonds can be formed on fine pitch bonding pads.

5. A method as recited in claim 2 wherein all edges within the cavity are rounded so that all edges of the ball bond are molded to be rounded.

6. A method as recited in claim 2 wherein the recessed surface is horizontally tapered.

7. A method as recited in claim 2 wherein the ball bond has substantially no flash.

8. A capillary for use in a wire bonding apparatus, the capillary comprising a capillary body including a capillary tip having a cavity formed therein that defines cavity walls and a recessed tip surface in the capillary body, the portion of the capillary tip outside of the cavity defining a wedge surface, the capillary body further including a wire feed bore sized suitably for receiving a bonding wire therethrough and a chamfer area in which the wire feed bore opens into the cavity, wherein the cavity and chamfer area are sized and shaped to mold balls formed during ball bonding into a shape that is substantially similar to the shape of the cavity and at least a portion of the chamfer area and wherein the wedge surface of the capillary body is suitable for wedge bonding.

9. A capillary as recited in claim 8 wherein the capillary body is tapered towards the capillary tip.

10. A capillary as recited in claim 8 wherein the cavity is substantially cylindrical.

11. A capillary as recited in claim 8 wherein the cavity is substantially frusto-conical.

12. A capillary as recited in claim 8 wherein the cavity is substantially cylindrical and has a diameter greater than a maximum diameter of the chamfer area.

13. A capillary as recited in claim 8 wherein the cavity walls are tapered.

14. A capillary as recited in claim 8 wherein the recessed tip surface is horizontally tapered.

15. A capillary as recited in claim 8 wherein all edges within the cavity are rounded.

16. A capillary as recited in claim 8 wherein the wire feed bore has a diameter of approximately 33 microns.

* * * * *